United States Patent
Gnausch et al.

(10) Patent No.: US 11,906,579 B2
(45) Date of Patent: Feb. 20, 2024

(54) WAFER-LEVEL TEST METHOD FOR OPTOELECTRONIC CHIPS

(71) Applicant: JENOPTIK Optical Systems GmbH, Jena (DE)

(72) Inventors: Tobias Gnausch, Jena (DE); Armin Grundmann, Jena (DE); Thomas Kaden, Dresden (DE); Norik Janunts, Jena (DE); Robert Buettner, Jena (DE); Christian Karras, Jena (DE)

(73) Assignee: JENOPTIK GmbH, Jena (DE)

( * ) Notice: Subject to any disclaimer, the term of this patent is extended or adjusted under 35 U.S.C. 154(b) by 137 days.

(21) Appl. No.: 17/770,916

(22) PCT Filed: Jun. 19, 2020

(86) PCT No.: PCT/DE2020/100521
§ 371 (c)(1),
(2) Date: Apr. 21, 2022

(87) PCT Pub. No.: WO2021/078318
PCT Pub. Date: Apr. 29, 2021

(65) Prior Publication Data
US 2022/0397602 A1 Dec. 15, 2022

(30) Foreign Application Priority Data
Oct. 25, 2019 (DE) ..................... 10 2019 007 516.1

(51) Int. Cl.
*G01R 31/28* (2006.01)
*G01R 31/311* (2006.01)

(52) U.S. Cl.
CPC ........ *G01R 31/311* (2013.01); *G01R 31/2886* (2013.01)

(58) Field of Classification Search
CPC .............. G01R 31/2891; G01R 31/311; G01R 31/2889; G01R 1/071; G01R 31/31728;
(Continued)

(56) References Cited

U.S. PATENT DOCUMENTS

| 7,109,739 B2 | 9/2006 | Gothoskar et al. |
| 7,378,861 B1 | 5/2008 | Malendevich et al. |

(Continued)

FOREIGN PATENT DOCUMENTS

| DE | 102 97 648 T5 | 1/2005 |
| DE | 10 2018 108 283 A1 | 10/2019 |

(Continued)

OTHER PUBLICATIONS

Taillaert, Dirk, et al., "Grating Couplers for Coupling between Optical Fibers and Nanophotonic Waveguides," *Japanese Journal of Applied Physics*, vol. 45, No. 8A, pp. 6071-6077 (2006).
(Continued)

*Primary Examiner* — Jermele M Hollington
*Assistant Examiner* — Courtney G McDonnough
(74) *Attorney, Agent, or Firm* — Christensen, Fonder, Dardi & Herbert PLLC

(57) ABSTRACT

A method for the testing of optoelectronic chips which are arranged on a wafer and have electrical interfaces in the form of contact pads and optical interfaces which are arranged to be fixed relative thereto in the form of optical deflection elements, e.g., grating couplers, with a specific coupling angle. The wafer is adjusted in three adjustment steps with one of the chips relative to a contacting module such that the electrical interfaces of the chip and contacting module contact one another, and the optical interfaces of the chip and contacting module occupy a maximum position of the optical coupling.

6 Claims, 1 Drawing Sheet

(58) Field of Classification Search
CPC ..... G01R 1/06794; G01R 3/00; G01M 11/00; G02B 6/422; G02B 6/43; G02B 6/4219; G02B 7/006; H04B 10/803
USPC .......................................................... 324/501
See application file for complete search history.

(56) References Cited

U.S. PATENT DOCUMENTS

| | | | |
|---|---|---|---|
| 2005/0194990 A1* | 9/2005 | Gothoskar | G02B 6/34 324/754.23 |
| 2006/0109015 A1 | 5/2006 | Thacker et al. | |
| 2008/0042675 A1 | 2/2008 | Navratil et al. | |
| 2011/0279812 A1 | 11/2011 | Masuda | |
| 2013/0001405 A1 | 1/2013 | Walker | |
| 2018/0010906 A1 | 1/2018 | Tokushima | |
| 2020/0378865 A1 | 12/2020 | Gnausch et al. | |
| 2021/0033643 A1 | 2/2021 | Huebner et al. | |

FOREIGN PATENT DOCUMENTS

| | | |
|---|---|---|
| JP | 2005-351807 A | 12/2005 |
| WO | WO 2019/029765 A1 | 2/2019 |

OTHER PUBLICATIONS

DeCoster, Jeroen, et al., "Test-station for flexible semi-automatic wafer-level silicon photonics testing," *IEEE European Test Symposium*, 6 pages (2016).

* cited by examiner

WAFER-LEVEL TEST METHOD FOR OPTOELECTRONIC CHIPS

PRIORITY CLAIM

The present application is a National Phase entry of PCT Application No. PCT/DE2020/100521, filed Jun. 19, 2020, which claims priority to German Patent Application No. 10 2019 007 516.1, filed Oct. 25, 2019, the disclosures of which are hereby incorporated by reference herein in their entirety.

FIELD OF THE INVENTION

The invention is directed to a method by which the functionality of electrical and optical components and circuits of a chip can be tested simultaneously at wafer level in a wafer prober. Such a method is generically known from US 2011/0279812 A1.

BACKGROUND OF THE INVENTION

The invention resides in the field of wafer-level testing and qualification of chips with optically/electrically integrated circuits, or PICs (photonic integrated circuits) as they are called. In contrast to conventional, purely electrical integrated circuits, or ICs, optical functionalities are also integrated in PICs in addition to the electrical circuits.

During the production of ICs, e.g., by means of CMOS technology, tests and measurements take place in various production stages in order to monitor the process on the one hand and to perform quality control on the other hand. An established test is the electrical wafer level test after fabrication of the wafer. In this test, functional and nonfunctional chips are identified and acquired in a wafer map whereby the yield is determined. Functional chips are also referred to as Known Good Dies (KGD). The non-functional chips are sorted out when the wafer is singulated into individual dice. The testing apparatus needed for the wafer level test is available in the form of wafer probers and wafer testers with associated contacting modules (also known as probe cards). By means of the contacting module, the device-side interfaces of the wafer tester are connected to the individual interfaces of the chips of the wafer which is fixed on the wafer prober. In principle, the contacting module can be constructed in such a way that it contacts only one chip or contacts a plurality of chips simultaneously. It is also not absolutely necessary for contacting that the chips still be in the wafer composite. In order to contact a plurality of chips of a wafer simultaneously or consecutively, the chips need only have a fixed and defined positional relationship to one another.

Testing apparatus for testing purely electronic chips (semiconductor chip with ICs) have been optimized and diversified over decades so that high volumes of highly diverse ICs can be qualified with high throughput to optimize costs.

The fabrication of PICs is generally carried out by the same established semiconductor processes, e.g., CMOS technology. In general, because the fabrication volumes for PICs have been very low up to now compared with IC production, only tests for process characterization and no functionality tests are performed on PICs in a semiconductor plant. Functional characterization rests with the end customers and is often carried out on sawed dice. The test apparatus employed makes use of independent, separate electrical and optical contacting modules and is not optimized for throughput.

The testing of PICs at wafer level requires that light be coupled into and out of the plane of the PIC generally by means of integrated grating couplers as coupling locations as is described in the technical literature "Grating Couplers for Coupling between Optical Fibers and Nanophotonic Waveguides" (D. Taillaert, et al., Japanese Journal of Applied Physics, Vol. 45, No. 8A, 2006, pp. 6071-6077). The grating couplers can be a functional component part in the chip or sacrificial structures on the wafer, e.g., in the scribe line or on neighboring chips.

According to the prior art, optical-fiber-based systems are utilized for the wafer level test as is described in the technical literature "Test-station for flexible semiautomatic wafer-level silicon photonics testing" (J. De Coster, et al., 21st IEEE European Test Symposium, ETS 2016, Amsterdam, Netherlands, May 23-27, 2016. IEEE 2016, ISBN 978-1-4673-9659-2). These systems comprise an optical-fiber-based optics module which couples light into and out of the coupling locations on the chip via individual optical fibers. In order to ensure an exactly repeatable optical coupling, the optical fibers must be aligned to the coupling locations with submicrometer accuracy at a distance of up to a few micrometers on the one hand. This is only possible with the aid of highly precise adjusting elements, e.g., combined hexapods and piezo elements. On the other hand, a time-intensive, active alignment sequence geared to achieving maximum coupling efficiency must be carried out before every individual optical coupling.

Accordingly, current wafer level test systems are characterized by:
- sequential, time-intensive contacting of all optical coupling locations of a chip consecutively, i.e., a parallel contacting of all of the optical coupling locations of the chip is possible, if at all, only to a highly limited degree, parallel contacting of a plurality chips is not possible at all;
- special solutions on the device side so that conventional wafer probers can only be refitted with complicated and cost-intensive modifications and are no longer usable thereafter for the wafer level test of ICs or only conditionally or not until after a time-consuming refitting;
- separate electronics modules and optics modules which are not fixedly interconnected, i.e., they must both be mounted and adjusted separately.

An optoelectronic contacting module (probe module) for testing chips (device under test—DUT 140) with electrical and optical inputs and outputs is known from the above-cited US 2006/0109015 A1. The contacting module constitutes an interface between a testing apparatus (ATE) and the test object (device under test or, briefly, DUT) and is constructed with electrical contacts (electrical probes), optical contacts (optical probes), optical elements and combinations thereof in order to route signals from and to the DUT and redistribute these signals for an interface to the test apparatus.

With regard to optical inputs and outputs, it is disclosed that the latter are provided via optical elements which are located on the contacting plate and/or the redistribution plate and are adjusted to various coupling mechanisms, e.g., free-space, quasi-free-space or waveguide. Diffractive elements and refractive elements are indicated as suitable optical elements for this purpose. It is also indicated that a photodetector or a light source can be arranged directly at the interface to the DUT which then represent the optical input or output on the contacting plate.

The above-cited US 2006/0109015 A1 further teaches that for carrying out optical coupling via free-space or quasi-free-space connections in which the optical signal is transmitted through a free space between the optical element and the interface on the DUT, the optical signal is focused or collimated in order to achieve a high coupling efficiency of the transmitted signal. Consequently, the signal coupling in this case is governed by the concept of coupling the signal as completely as possible.

According to an embodiment example of the above-cited US 2006/0109015 A1, the optical and electrical signal routing (optical and electrical distribution network) is carried out on separate redistribution plates. It is suggested to route the electrical signals from the DUT to the peripheral regions of the contacting plate so that the electrical signals are coupled in over the peripheral region in the first redistribution plate arranged over the contacting plate. In this way, an opening can be formed in the first redistribution plate in which only the electrical signals are redistributed, the optical signals being routed through this opening into a separate second redistribution plate arranged above the first redistribution plate.

To summarize, the above-cited US 2006/0109015 A1 shows a number of ideas about how a contacting module, which is divided into a contacting plate and a redistribution plate by reason of wear of the mechanical contacts for electrical signal transmission, for example, could be additionally outfitted with optical signal lines. This does not at all take into account the fact that the possible tolerances for the mechanical contact between the electrical inputs and outputs of the contacting module and the DUT are not transferrable to the optical inputs and outputs.

While the transmission of an electrical signal that is always the same merely requires a mechanical contact between needles present on the contacting module and contact pads present on the DUT, which can be ensured within a comparatively large positional tolerance of a few micrometers in all three spatial directions, the quality of the optical signal transmission is affected even by a much smaller deviation from a target position in the submicrometer range.

If the coupling efficiency of the optical signal is optimized by collimating or focusing the optical beam as is described in the above-cited US 2006/0109015 A1, the entire contacting module must be aligned in a highly precise manner in the submicrometer range. Otherwise, the repeatability accuracy of the measurement, which depends on the alignment, is not sufficient for the applications described. In turn, the contacting module cannot utilize the alignment tolerances for electrical contacting in the range of a few micrometers in X, Y and Z directions which are typical in conventional electric wafer probers. Elaborate and expensive special solutions for wafer probers, including with various adjusting elements, e.g., piezo actuators and linear axes or hexapods, are needed in order to align the contacting module with the DUT with high accuracy.

Another critical point is that for a neat electrical alignment of the needles an overdriving of typically several tens of micrometers is carried out in Z direction, i.e., after initial contact of the needles with the electrical contact pads, the contacting module is moved by an additional amount in Z direction to ensure a reliable electrical contact. Wear and deformation of the needles are generally offset by adjusting the overdrive during operation. During a simple collimation or focusing of the optical beam, as is described in the above-cited US 2006/0109015 A1, the working distance in Z direction may only vary within the micrometer range for an accurately repeatable coupling. Accordingly, this type of optical coupling is not compatible with established electrical contacting methods.

US 2011/0279812 A1 discloses a contacting module for testing chips with electrical and optical inputs and outputs. The chip is received on a movable carrier with which it can be roughly aligned with the contacting module. The coarse alignment is carried out under sensor control based on a monitoring of the position of the chip or of the alignment marks of the chip. The fine adjustment of the chip takes place in two method steps. In the first method step, it is checked whether or not the electrical inputs and outputs are in contact with the contacting module. To this end, suction is exerted between the chip and the contacting module so that the electrical inputs and outputs of the chip come in contact with the electrical contacts of the contacting module. A test signal tests for a successful contact and a correction is made in the event of a defective contact by repeating a coarse alignment. In the second method step, the alignment of the optical inputs and outputs is carried out. The optical inputs and outputs of the chip can receive or send focused or collimated beams with suitable aperture and focusing position. The optical inputs and outputs of the contacting module have variable optics with which beams can be generated which are focused perpendicularly on the surface of the optical inputs and outputs, the axial and lateral focusing position and the aperture of the beams being adjustable. For the adjustment, the variable optics have at least one optical element with variable focal distance and/or at least one optical element which is movable. The focus position is adjusted axially based on distance measurements by means of additional distance sensors or by intensity measurements based on an optical test signal. The lateral adjustment of the focus position is carried out based on intensity measurements in which a test beam which is already focused on the surface of the chip is moved in a scanning relative movement with respect to the optical inputs and outputs until the test beam is optimally coupled into the optical inputs and outputs. The time required for this can be reduced in that the scanning relative movement is initially carried out with an increased focal diameter of the test beam. After the fine adjustment, the chip is tested by means of special electrical and optical test signal sequences. When a plurality of identical chips are tested, portions of the coarse adjustment and fine adjustment are stored and can be used again.

For testing electronic chips at wafer level, it is known from practice that the spatial position of the tips of the needles is determined by means of a first camera and the spatial position of the centers of the contact pads of a chip is determined with a second camera. Control signals are formed from a relative position of the tips with respect to the contact pads derived therefrom and are used to control a positioning table, the centers of the contact pads being positioned in vertical alignment below the tips before the contact needles are brought into contact with the contact pads.

SUMMARY OF THE INVENTION

It is an object of the invention to find a method for the testing of optoelectronic chips which are arranged on a wafer and have electrical interfaces in the form of contact pads and optical interfaces which are arranged to be fixed relative thereto in the form of optical deflection elements with a specific coupling angle, which method is based on proven methods for the testing of electronic chips.

This object is met by a method for the testing of optoelectronic chips which are arranged on a wafer and have electrical interfaces in the form of contact pads and optical interfaces which are arranged to be fixed relative thereto in the form of optical deflection elements. The optical deflection elements have a specific coupling angle.

The wafer is received by a positioning table which is adjustable in X direction, Y direction and Z direction of a Cartesian coordinate system and which is rotatable around the Z axis. A contacting module is provided which has electrical interfaces and optical interfaces associated with the chips and is adjustable and rotatable relative to the positioning table.

In a first adjustment step, the wafer is fed to the contacting module in such a way that the electrical interfaces in the form of needles which are provided on the contacting module are disposed vertically above the centers of the contact pads of a first one of the chips in a first adjustment position. In this first adjustment position, the contacting module is arranged in Z direction at an adjustment distance from the first one of the chips that is greater than a free length of the needles such that the needles have no contact with the contact pads during the next adjustment step.

Proceeding from this first adjustment position, the relative alignment of the optical deflection elements with respect to the optical interfaces provided on the contacting module is carried out in further adjustment steps. The contact pads are so dimensioned that the adjustment displacements required in the further adjustment steps are just large enough for the needles to achieve contact with the contact pads subsequent to being lowered.

In a scanning field smaller than the size of the contact pads, the positioning table is initially deflected into a second adjustment position in X direction and Y direction relative to the first adjustment position. Meanwhile, an optical signal is routed via at least one of the optical interfaces of the contacting module and one of the optical deflection elements. The second adjustment position is occupied when the optical signal is coupled in with a maximum intensity. Subsequently, the first one of the chips is deflected in X-Y direction by an adjustment displacement into a third adjustment position after the adjustment displacement was calculated from the feed displacement and the coupling angle of the relevant optical deflection element.

Subsequently, the positioning table is fed to the contacting module in Z direction by a feed displacement in an optical working distance in which the needles contact the contact pads with a predefined pressing force.

To test the optoelectronic chip, electrical signal and optical signals are routed via the interfaces respectively associated with one another.

A difference in position resulting from the first adjustment position and the second adjustment position of the first one of the chips is stored as an offset and taken into account for the adjustment of further chips after the latter have been positioned in a first adjustment position with respect to the contacting module.

In particular, to take into account the wear of the needle tips, it is advantageous when the optical working distance at which the needles contact the contact pads with a predefined pressing force is monitored and the third adjustment position is corrected when there are changes in the pressing force.

Due to the fact that the change in the optical working distance is determined long-term over the useful life of the contacting module, it is advantageously possible for implementation of the method to replace the needles of the contacting module with new needles when the optical working distance falls below a predetermined minimum distance.

In particular, positional tolerances of the optical interfaces of the chips relative to one another are compensated in that the optical signals advantageously over-radiate the respective interface when coupled in.

It is even more advantageous when the optical signals routed via the interfaces which are respectively associated with one another have a tophead distribution of their radiation intensity when coupled in.

BRIEF DESCRIPTION OF THE DRAWINGS

The invention will be described in more detail in the following referring to embodiment examples with the aid of drawings. The drawings show.

DETAILED DESCRIPTION

Figure 1A:
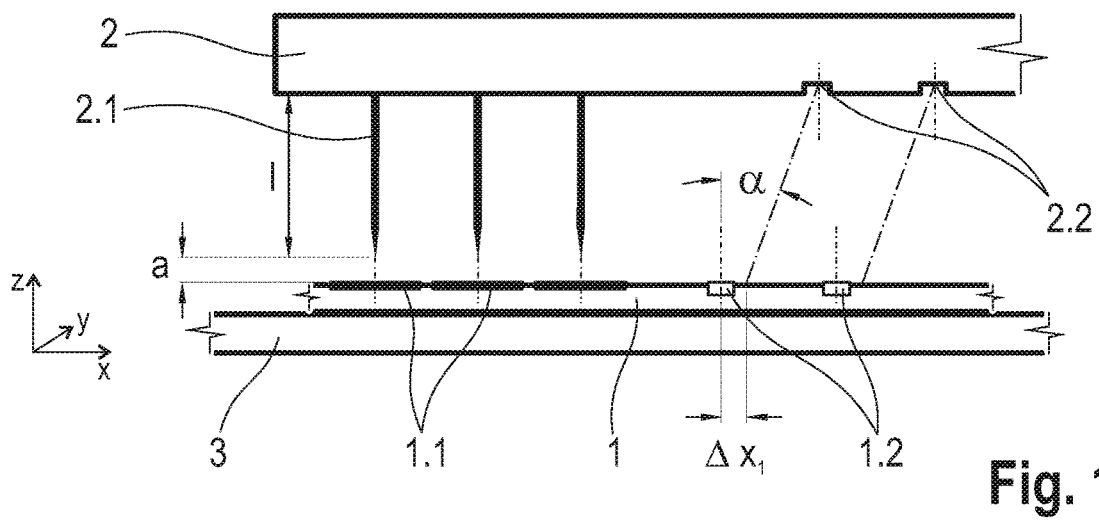
FIG. 1a a chip arranged in a first adjustment position (nominal position) relative to the contacting module.

Optoelectronic chips 1 which are arranged on a wafer and have electrical interfaces in the form of contact pads 1.1 and optical interfaces in the form of optical deflection elements 1.1, e.g., grating couplers or mirrors, with a specific coupling angle $\alpha$ which are fixedly arranged relative to the electrical interfaces are tested with a method according to the invention. The specific coupling angle $\alpha$ represents an angle formed by an optical signal, or the principal ray thereof, with a vertical line on the chip 1. It is typically greater than 0° and less than 25°. A common value for the specific coupling angle $\alpha$ is, e.g., 11.6° and relates to the optical fibers with corresponding V bevel which are utilized in the end application of the chip for coupling.

As in a method of the prior art, a wafer is received by a positioning table 3 which is adjustable in X direction, Y direction and Z direction of a Cartesian coordinate system relative to a contacting module 2 and rotatable around the Z axis. In addition to electrical interfaces 2.1 which are associable with the chips 1, the contacting module 2 also has optical interfaces 2.2 which are associable therewith. The electrical interfaces and the optical interfaces of the chips 1 are produced in the wafer composite using different technologies and in different method steps such that they have only narrow positional tolerances with respect to one another subject to the arrangements formed by the electrical interfaces, but have comparatively large tolerance deviations from the arrangements formed by the optical interfaces, particularly with respect to different wafers.

In a first adjustment step, the wafer is fed to the contacting module 2 such that in a first adjustment position (nominal position) the electrical interfaces on the contacting module 2 in the form of needles 1.1 are arranged vertically above the centers of the contact pads 1.1 of a first one of the chips 1. During the adjustment, the contacting module has an adjusting distance a from the chip 1 in Z direction that is greater than the free length l of the needles 2.1 so that the tips of needles 2.1 cannot come in contact with the contact pads 1.1. In this regard, reference is made to FIG. 1a. In this figure, as also in the other figures, for the sake of simplicity, the adjustment in Y direction is not depicted. Accordingly, adjustment displacements during individual adjustment steps are only represented as adjustment displacements in X direction.

This adjustment step advantageously proceeds in accordance with a fixed routine known from practice. In so doing, a camera measures the needles 2 by focusing on the tips of the needles, and a second camera measures the contact pads 1.1 of the chip 1. Both cameras have been referenced with respect to one another beforehand by means of a measurement standard. This allows subsequently an accurate calculation of the optimal position (nominal position) of the needles 2 with respect to the contact pads 1.1 and, therefore, the positioning of the contact module 2 with respect to the chip 1. This is usually accomplished by regression and extrapolation of the measured values. In addition, for every needle 2 found, a contact pad 1.1 is expected as complementary part. In this routine, participation of the user is generally excluded. Also, alternative structures such as alignment marks, etc. for positioning may usually not be used. Not only can the X-Y position and a rotation around the Z axis be corrected via the cameras, but the Z position can also be determined.

It will be clear to the person skilled in the art that, due to positional tolerances of the needle tips relative to one another and of the centers of the contact pads 1.1 relative to one another, not all of the needle tips can really be arranged exactly over the centers of the contact pads 1.1 simultaneously and that, ultimately, a position is adjusted in which the mean deviation is smallest. However, the positional tolerance of the electrical interfaces relative to one another is negligibly small compared to the positional tolerance of the arrangement of the electrical interfaces with respect to the arrangement of the optical interfaces of a chip 1. The reason for this is that the electrical interfaces and the optical interfaces are produced in succession and by different technologies.

Since the production of the electrical interfaces and the production of the optical interfaces is carried out in one process flow for all of the chips of a wafer, the deviation in position between the arrangements of the electrical interfaces and the arrangements of the optical interfaces of individual chips of a wafer are at least approximately identical.

After the arrangement of electrical contacts of the chips 1 (needles 2.1) is aligned to the electrical contacts of the contacting module 2 (contact pads 1), the actual position of the optical interfaces of the chip with respect to the optical interfaces on the contacting module 2.2 deviates from a target position for various reasons (see FIG. 1a).

First of all, the position of the optical interfaces on the chip 1 deviates from its target position in X direction, Y direction and Z direction and around the Z direction in a randomly variable manner in each wafer, while the deviations around the X direction and around the Y direction can be assumed to be invariable (systematic deviations) due to the orientation of the positioning table 3 once the chip 1 and, therefore, the wafer have been fixed in position.

Second, there is a deviation of the position of the optical interfaces on the contacting module 2.2 from a target position with respect to the needles 2.1 depending on the assembly accuracy of the optical module which is an integral component part of the contacting module. This relates not only to deviations in position in the X direction, Y direction and Z direction but also to tilting around the Z direction, X direction and Y direction. All six parameters relate to assembly-dependent systematic deviations.

Third, various deviations occur over the life of the contacting module 2. This is caused by mechanical wear and associated dimensional change of the needle tips and possible bending and resulting change in fit.

By way of the camera measurements, the positioning table 3 de facto correspondingly re-corrects the position of the entire contacting module 2 relative to the chip/wafer and, accordingly, also changes the position of the arrangement of optical interfaces of the contacting module 2.2 relative to the arrangement of optical interfaces on the chip 1 based on the specific coupling angle of the respective optical deflection element, particularly a grating coupler.

The relative alignment of the optical interfaces of the first chip 1 with respect to the optical interfaces provided on the contacting module is carried out in further adjustment steps.

Assuming that the needles 2.1, as electrical interfaces on the contacting module 2, are optimally aligned to the centers of the contacting pads 1.1 as electrical interfaces on the chip 1, a free space results due to the size of the contact pads 1.1 for adjusting the optical interfaces of the chip 1 relative to those on the contacting module, since it is sufficient for transmission of the electrical signal that a mechanical contact exists between the needle tip and the contact pad.

Figure 1B:
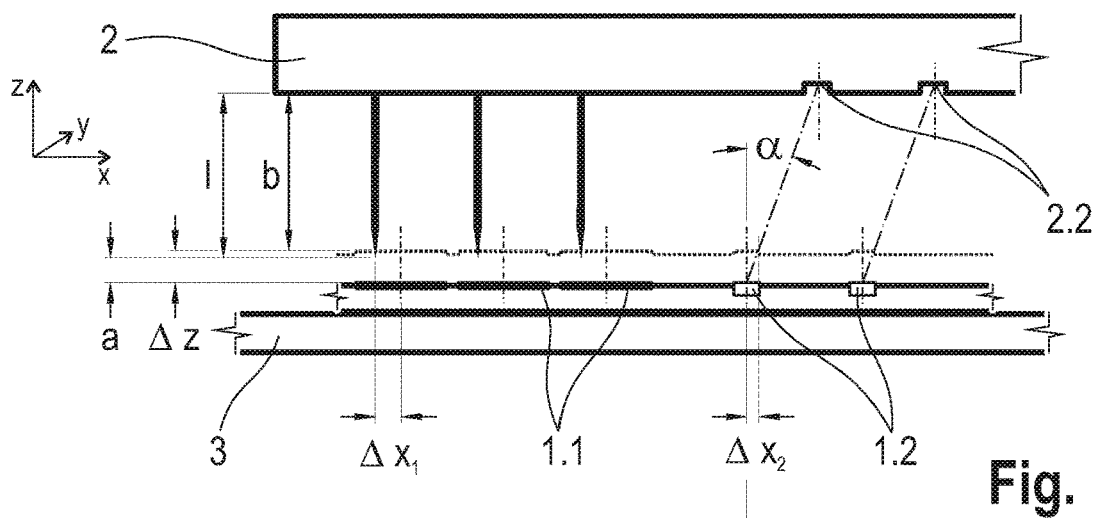
FIG. 1b the chip arranged in a second adjustment position relative to the contacting module.

The relative alignment of the optical interfaces of the chip and contacting module with respect to one another is carried out in a first further adjustment step in that the positioning table is deflected (raster scan) relative to the first adjustment position in X direction and Y direction into a second adjustment position in a scanning field that is smaller than the size of the contact pads as is illustrated in FIG. 1b by first adjustment displacement $\Delta x1$. In the meantime, an optical signal is routed via at least one of the optical interfaces of the contacting module and of the first chip. The second adjustment position is occupied when the optical signal is coupled in with a maximum intensity (see FIG. 1b).

Figure 1C:
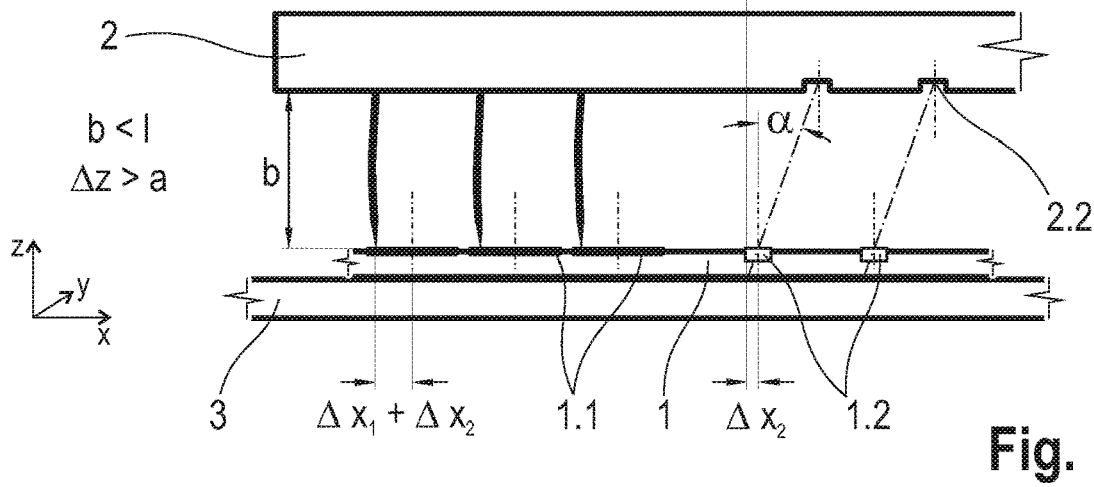
FIG. 1c the chip arranged in a third adjustment position (maximum position of the optical coupling) relative to the contacting module.

Subsequently, in a second further adjustment step, the positioning table is deflected in X direction and Y direction into a third adjustment position as is indicated in FIG. 1c by second adjustment displacement $\Delta x2$. The adjusting distance from the second adjustment position into the third adjustment position is calculated from the feed displacement $\Delta z$ and the coupling angle $\alpha$ of the relevant grating coupler before the positioning table is fed to the contacting module in Z direction by feed displacement $\Delta z$ in the optical working distance b in which the needles contact the contact pads with a pre-definable constant pressing force. This is achieved in that the optical working distance is smaller than the free length of the needles 1. The difference is referred to as overtravel or overdrive.

The overtravel ensures a secure electrical contact of the needles with the contact pads (low contact resistance). After the initial light contact of the needles with the contact pads, the wafer is moved upward in Z direction again by several tens of micrometers. This achieves two things: first, the needles are forced to scratch over the contact pad so that the oxide surface is penetrated and a reproducible, low-resistance contact is achieved. Second, the overtravel generates a constant pressing pressure of the needles, since the needles deflect correspondingly due to the additional adjustment displacement and exert a pressing force on the contact pad. This pressing force varies depending on the type of needle used, but is assumed to be on the order of approximately 3 g per needle. The overtravel is typically indicated in multiples of a mil (U.S. 1 mil=1/1000 inch=0.0254 mm).

In the case of a contacting module in which the arrangement of the needles has a fixed position with respect to the optical interfaces, the value of the overtravel must be taken into account during the final adjustment of the chip so that, in the contacted state, it is ensured that there is an optical working distance between the optical interfaces of the contacting module and the chip at which there is a maximum coupling of the optical signals.

In order to adjust the optical working distance b, the chip is moved into the third adjustment position. In this third adjustment position, the final adjustment state is produced in which the electrical interfaces and the optical interfaces of the chip and contacting module are optimally aligned relative to one another, i.e., there is optimum measurability of the optical signal flows (maximum position of the optical coupling), and there is electrical signal flow as well. Subsequently, electrical signals and optical signals are routed via the interfaces associated with one another in order to test the chip.

The adjustment displacement from the first adjustment position (nominal position) to the third adjustment position (maximum position of optical coupling) constitutes an offset (shown in FIG. 1c as $\Delta x1+\Delta x2$, and $\Delta z$) which is advantageously stored and taken into account when adjusting all of the further chips on this wafer; that is, the nominal position of the positioning table is corrected by this offset. However, this presupposes a corresponding displacement of the needles over the contact pads that is still tolerable.

This procedure need only be performed one time per wafer or at even greater intervals.

Further, this offset value and changes thereof can be observed over time and can accordingly supply information about wear and associated changes in the needles.

In order that the offset can be determined with greater accuracy, the raster scan can also be performed on a plurality of chips of the wafer before the start of testing of all of the chips of the wafer, and the results can be averaged.

The required overtravel can change over the life of the contacting module after "breaking in" or due to wear of the needles, which results in a reduced working distance.

It is important to directly monitor the optical working distance to ensure the defined optical coupling characteristics between the contacting module and the chip (measurability) and to prevent collisions between the optical interfaces of the contacting module and of the chip (a few tens of μm to 100 μm distance in operation).

A displacement sensor fixedly integrated in the contacting module can be used for this purpose, e.g., a capacitive displacement sensor. This allows a control of the actual optical working distance. In combination with an active control, the working distance can be actively readjusted by moving the positioning table in Z direction and, if necessary, a hard stop can be programmed when the working distance falls below a minimum working distance, e.g., to prevent a collision due to human operating error.

Typically, a change in the needle tip positions can be expected when the contacting module is first put into operation (break-in curve). This can be preempted by repeated contact simulation (burn-in) before adjusting a first chip, so that the value of the offset to be adjusted can be reduced.

Usually, all of the optical interfaces of the chips, embodied by grating couplers, have coupling angles of identical amounts and an identical orientation so that a change in the optical working distance $\Delta b$ correspondingly gives an identical relative change $\Delta X$ of the optimal coupling position for all of the optical interfaces.

A change in the optical working distance $\Delta b$ is typically in the range of <50 μm. A change in the optical working distance of, e.g., 10 μm and a coupling angle $\alpha$ of 11.6° in the X-Z plane accordingly gives a change in the optimal coupling position $\Delta X$ of 2 μm in X direction. A change in the optical working distance $\Delta b$ of 20 μm gives a change in the optimal coupling position $\Delta X$ of 4 μm in X direction. This can still be countered by the correction described above, i.e., the positioning table is re-corrected in X direction by a control command, assuming that the needles still encounter the contact pads sufficiently securely.

The requirements for the accuracy of the adjustment steps can be reduced when the optical signals which are routed via the interfaces which are associated with one another for testing the chip over-radiate the interface to be coupled.

The optical signals advantageously have a tophead distribution of radiation intensity when impinging on the interface to be coupled.

REFERENCE CHARACTERS 1 chip
1.1 contact pad
1.2 optical deflection element
2 contacting module
2.1 needle
2.2 optical interface on the contacting module
3 positioning table
$\Delta z$ feed displacement
$\alpha$ coupling angle
a adjusting distance
b optical working distance
l free length of the needles
$\Delta x_1$ first adjustment displacement
$\Delta x_2$ second adjustment displacement

The invention claimed is:
1. A method for testing of optoelectronic chips which are arranged on a wafer and have electrical interfaces in a form of contact pads and optical interfaces which are arranged to be fixed relative thereto in a form of optical deflection elements with a specific coupling angle, comprising:
 a positioning table receiving the wafer the positioning table being adjustable relative to a contacting module in an X direction, Y direction and Z direction of a Cartesian coordinate system and being rotatable around the Z axis, wherein the contacting module has electrical interfaces in a form of needles which are associated with the contact pads, and optical interfaces which are associated with the optical deflection elements, and
 in a first adjustment step, feeding the wafer is to the contacting module in such a way that the needles are disposed vertically above centers of the contact pads of a first one of the chips in a first adjustment position,
 wherein the contacting module has an adjustment distance in the Z direction from a first one of the chips that is greater than a free length of the needles,
 in further adjustment steps, carrying out a relative alignment of the optical deflection elements with respect to the optical interfaces provided on the contacting module,
 then feeding the positioning table to the contacting module in the Z direction using a feed displacement in an optical working distance in which the needles contact the contact pads with a predefined pressing force, and
 subsequently routing electrical signals and optical signals via the interfaces which are associated with one another, wherein:
 the relative alignment of the optical deflection elements with respect to the optical interfaces provided on the contacting module is carried out by:

in a scanning field smaller than a size of the contact pads, initially deflecting the positioning table into a second adjustment position in the X direction and the Y direction relative to the first adjustment position, while routing an optical signal via at least one of the optical interfaces of the contacting module and one of the optical deflection elements, wherein the second adjustment position is occupied when the optical signal is coupled in with a maximum intensity, and subsequently deflecting the first one of the chips is subsequently deflected in the X-Y direction by an adjustment displacement into a third adjustment position, wherein the adjustment displacement was calculated from the feed displacement and the coupling angle ($\alpha$) of a relevant optical deflection element before the positioning table is fed to the contacting module in the Z direction by the feed displacement in the optical working distance.

2. The method for testing optoelectronic chips arranged on a wafer, according to claim 1, wherein a difference in position resulting from the first adjustment position and the second adjustment position of the first one of the chips is stored as an offset and taken into account for adjustment of further chips after the further chips have been positioned in a first adjustment position with respect to the contacting module.

3. The method for testing optoelectronic chips arranged on a wafer, according to claim 1, wherein the optical working distance in which the needles contact the contact pads with the predefined pressing force is monitored, and the third adjustment position is corrected when there are changes in the pressing force.

4. The method for testing optoelectronic chips arranged on a wafer, according to claim 1, wherein a change in the optical working distance is determined long-term over a useful life of the contacting module and, for implementing the method, the needles of the contacting module are replaced by new needles when the optical working distance falls below a predetermined minimum distance.

5. The method for testing optoelectronic chips arranged on a wafer, according to claim 1, wherein, when the optical signals routed via the interfaces which are respectively associated with one another are coupled into one of the interfaces, they over-radiate the interface.

6. The method for testing optoelectronic chips arranged on a wafer, according to claim 1, wherein the optical signals routed via the interfaces which are respectively associated with one another have a tophead distribution of their radiation intensity when coupled into one of the interfaces.

* * * * *

UNITED STATES PATENT AND TRADEMARK OFFICE
CERTIFICATE OF CORRECTION

PATENT NO. : 11,906,579 B2
APPLICATION NO. : 17/770916
DATED : February 20, 2024
INVENTOR(S) : Gnausch et al.

Page 1 of 1

It is certified that error appears in the above-identified patent and that said Letters Patent is hereby corrected as shown below:

On the Title Page

(73) Assignee Currently Listed As:
JENTOPTIK GmbH

Change to the Following:
JENOPTIK Optical Systems GmbH

Signed and Sealed this
Twenty-third Day of April, 2024

Katherine Kelly Vidal
*Director of the United States Patent and Trademark Office*